(12) United States Patent
Schoch

(10) Patent No.: US 7,518,339 B2
(45) Date of Patent: Apr. 14, 2009

(54) STATE VARIABLE AND PARAMETER ESTIMATOR COMPRISING SEVERAL PARTIAL MODELS FOR AN ELECTRICAL ENERGY STORAGE DEVICE

(75) Inventor: Eberhard Schoch, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 32 days.

(21) Appl. No.: 10/544,097

(22) PCT Filed: Jan. 30, 2004

(86) PCT No.: PCT/DE2004/000144

§ 371 (c)(1), (2), (4) Date: Jun. 12, 2006

(87) PCT Pub. No.: WO2004/068157

PCT Pub. Date: Aug. 12, 2004

(65) Prior Publication Data

US 2007/0035307 A1 Feb. 15, 2007

(30) Foreign Application Priority Data

Jan. 30, 2003 (DE) ............................ 103 03 506
Jun. 23, 2003 (DE) ............................ 103 28 055

(51) Int. Cl.
*H01M 10/44* (2006.01)
(52) U.S. Cl. .................................... 320/132
(58) Field of Classification Search ............ 320/132, 320/149; 324/426, 430, 433; 340/635, 636.1, 340/636.11, 636.12
See application file for complete search history.

(56) References Cited

U.S. PATENT DOCUMENTS

2001/0009370 A1 7/2001 Meissner et al.
2003/0052690 A1* 3/2003 Schoch .................. 324/433

FOREIGN PATENT DOCUMENTS

| EP | 1 271 170 | 1/2003 |
| JP | 11093715 | 4/1999 |
| WO | 01/42799 | 6/2001 |
| WO | 02/41014 | 5/2002 |
| WO | 03/005052 | 1/2003 |

OTHER PUBLICATIONS

Shen et al., *Estimation of Battery Available Capacity Under Variable Discharge Currents*, Journal of Power Sources, Elsevier Sequoia S,A, Lausanne, Switzerland, vol. 103, No. 2, Jan. 2, 2002, pp. 180-187.

Baert et al., *Lead-Acid Battery Model for the Derivation of Peukert's Law*, Electrochimica Acta, Elsevier Sciense Publishers, Great Britain, vol. 44, No. 20, Jan. 6, 1999, pp. 3491-3504.

* cited by examiner

*Primary Examiner*—Edward Tso
(74) *Attorney, Agent, or Firm*—Kenyon & Kenyon LLP

(57) ABSTRACT

A state variable and parameter estimator for determining state variables and parameters of a mathematical energy storage model, especially of a battery model, which calculates the state variables and the parameters from operating variables of an energy storage device. A particularly simple estimation of the state variables and the parameters may be carried out if the state variable and parameter estimator includes a plurality of mathematical submodels which are valid for different working ranges and/or frequency ranges of the energy storage device.

25 Claims, 5 Drawing Sheets

STATE VARIABLE AND PARAMETER ESTIMATOR COMPRISING SEVERAL PARTIAL MODELS FOR AN ELECTRICAL ENERGY STORAGE DEVICE

FIELD OF THE INVENTION

The present invention relates to the determination of state variables and parameters of a mathematical energy storage model, especially a battery model.

BACKGROUND INFORMATION

In electrical networks, such as in motor vehicle electrical systems, as a rule, several electrical users are supplied with power by one electrical energy storage device, such as a battery. In order to perform energy management and user management, in which users, depending on requirements, may be automatically switched on and off, knowledge of the capacity of the energy storage device is of essential importance. If the capacity of the energy storage device is known, especially the load that may still be drawn before undershooting a requisite minimum capacity, such as for an engine start, then, even before a short supply sets in, use-reducing or capacity-increasing measures may be introduced, such as switching off certain users, and thus a failure of the electrical supply may be prevented.

In order to estimate the capacity of the energy storage device, it is known that one may use mathematical models that describe the electrical properties of the energy storage. While taking into account current operating variables of the energy storage, such as a current battery voltage $U_{Batt}$, the current battery current $I_{Batt}$ and the current battery temperature $T_{Batt}$, the capacity of the energy storage device may be estimated, with the aid of the mathematical models. A device, known from the related art, for determining the load that may be drawn from an energy storage, is shown in FIG. 1.

SUMMARY OF THE INVENTION

FIG. 1 shows a device for determining the load that may be drawn from an energy store, especially from a vehicle battery, up to a prespecified cutoff criterion. The device includes a state variable and parameter estimator 1, and a load predictor 2, in which the mathematical energy storage model is stored. State variable and parameter estimator 1 is used to calculate state variables Z and/or parameters P from current operating variables of the battery, namely the battery voltage $U_{Batt}$, the battery current $I_{Batt}$ and the battery temperature $T_{Batt}$, based on which load predictor 2 calculates the desired information, such as the load $Q_e$ that may be drawn from the battery, or other variables, such as the time $t_e$ to the time of reaching a cutoff criterion or load state SOC. In addition, a discharge current profile $I_{Batt,entl}$ and a temperature progression $T_{Batt,entl}$ may be supplied to load predictor 2.

In this description, as state variables Z are counted especially internal voltages U, which are seen in the respective equivalent circuit diagram of the energy storage device or the mathematical model on which it is based. In the case of the named parameters, constant values are involved, such as resistances R and storage capacities C in the equivalent circuit diagram or the mathematical energy storage model.

The load computation carried out by load predictor 2 takes place starting from the current state of the energy storage device. Therefore, the mathematical models stored in load predictor 2 are first initialized to the operating state of the energy storage device. For this, state variable and parameter estimator 1 supplies the corresponding initial values. A known Kalman filter may be used, for instance, as a state variable and parameter estimator. Starting from the initialization state, load predictor 2 may calculate, for example, load $Q_e$ that may be drawn from the energy storage for a predefined discharge current and a current battery temperature.

FIG. 2 shows an example of an equivalent circuit diagram for the discharge operation of a lead battery ($I_{Batt}$<0A, $U_{Dp}$<0V, $U_{Dn}$<0V). In this context, the individual equivalent circuit diagram variables are as follows, from left to right:

$R_i(U_{CO}, U_e, T_{Batt})$ ohmic internal resistance, dependent on open-circuit voltage $U_{CO}$, electrolyte voltage $U_e$ and acid temperature $T_{Batt}$.

$UR_i$ ohmic voltage drop $C_0$ acid capacity $U_{CO}$ open-circuit voltage $R_k$ ($U_{CO}$, $T_{Batt}$) acid diffusion resistance, depending on the open-circuit voltage $U_{CO}$ (degree of discharge) and acid temperature $T_{Batt}$ $tau_k = R_k * C_k$ (time constant of the acid diffusion) is assumed to be a constant of the order of magnitude of 10 min.

$U_k$ concentration polarization $U_e = U_{CO} + U_k$ (electrolyte voltage)

$U_D$ ($I_{Batt}$, $T_{Batt}$) stationary charge transfer polarization at the positive electrode of the battery ($U_{Dp}$) and the negative electrode ($U_{Dn}$), dependent on battery current $I_{Batt}$ and the acid temperature $T_{Batt}$.

$U_{Batt}$ terminal voltage of the battery

The individual equivalent circuit diagram variables refer to various physical effects of the battery, which are known to one skilled in the art from the relevant literature.

For ohmic internal resistance $R_i$, for example, the following relationship may be applied:

$$R_i(U_{CO}, U_e, T_{Batt}) = R_{i0}(T_{Batt}) * (1 + R_{Ifakt} * (U_{COmax} - U_{CO})/(U_e - U_{e,grenz}))$$

$$R_{i0}(T_{Batt}) = R_{i025}/(1 + TK_{Lfakt} * (T_{Batt} - 25° C.))$$

where $R_{i025}$ ohmic internal resistance at full load and $T_{Batt}$=25° C.

$TK_{Lfakt}$ temperature coefficient of the battery conductivity $R_{Ifakt}$ characteristics map parameter $U_{COmax}$ maximum open-circuit voltage of the fully loaded battery $U_{e,grenz}$ electrolyte voltage at cutoff (varies with aging)

For other equivalent circuit diagram variables (e.g. $U_D$, $U_k$), load predictor 2 includes other correspondingly suitable mathematical formulations. The mathematical model of the energy storage device includes mathematical formulations, at least for the internal resistance $R_i$, acid diffusion resistance $R_k$ and a charge transfer polarization $U_D$.

The state variables supply the information about the energy content of the energy storage device of a system. In the equivalent circuit diagram they correspond to the voltages at the storage capacitors, that is, $U_{CO}$ and $U_k$. For the model-based determination of the capacity of the energy storage device, besides the state variables, the model parameters also have to be known. In particular, parameters that are greatly subject to changes due to aging, such as parameters $R_{i025}$ and $U_{e,grenz}$ have to be adapted to the characteristics curve of the ohmic resistance.

State variables Z and parameters P that are ascertained by state variable and parameter estimator 1 may be used, for example, for the determination of the load state of the battery, a current or future capacity, as well as, for example, the load that may be drawn from the energy storage device.

Customary predictors (estimating devices), such as, for instance, load predictor 2 shown in FIG. 1, usually include very costly models having many state variables and parameters which cover the behavior of the energy storage device over a wide working range. The computation of the state variables and the parameters is correspondingly costly and complicated. On the other hand, other predictors include simple models having few state variables and parameters, which, however, describe the behavior of the energy storage device only at certain working points or at certain frequencies.

Therefore, it is the object of the present invention to create a simple and rapid method for estimating state variables and/or parameters for a mathematical energy storage model, which has validity over the entire working range and frequency range of the energy storage device.

The essential idea of the present invention is to provide, in the state variable and parameter estimator, a plurality of mathematical submodels for estimating state variables and/or parameters, which apply at different working ranges and/or frequency ranges of the energy storage device. In this context, the working ranges and/or the frequency ranges of the individual submodels may overlap. Overall, the submodels essentially cover the entire frequency range and working range of the energy storage device.

This makes it possible to have a continuous estimating of state variables and parameters in the entire working range and frequency range of the energy storage device. By utilizing the submodels according to the present invention, the number of state variables and parameters, that are to be estimated, may be kept small, and thereby the danger of an ambiguous estimate may be minimized. Furthermore, by the subdivision into submodels, a more effective utilization of processor capacity is made possible: "Slow" submodels having large time constants are able to be processed independently of "rapid" submodels having a smaller scanning rate.

Preferably, a current ($I_{Batt}$) or a voltage ($U_{Batt}$) of the energy storage unit is supplied to the submodels, the current ($I_{Batt}$) or the voltage ($U_{Batt}$) being restricted by a filter to the frequency range that is valid for the respective submodel. Thus, highpass filters, lowpass filters or bandpass filters may be preconnected to the submodels.

According to one preferred specific embodiment of the present invention, an error is ascertained between an operating variable ($U_{Batt}$, $I_{Batt}$) of the energy storage device and an operating variable ($U_{Batt'}$, $I_{Batt'}$) calculated by a submodel, and is coupled back into the respective submodel (self-feedback). Because of the self-feedback, the state variables and parameters that are to be calculated may be adapted to the actual state of the energy storage device.

Optionally, the error may also be coupled back into another submodel (external feedback). Because of the external feedback, the state variables and parameters, which are being simultaneously calculated by several submodels, may be adjusted with respect to one another.

The errors that are supplied to a submodel by self-feedback or external feedback are preferably weighted using a weighting factor. In this way the sensitivity of a submodel may be set with respect to different errors.

State variables and/or parameters which were estimated by a submodel and are also included in another submodel are preferably also supplied to the other submodel. There they may be used as starting values, fixed values or as correcting values for the estimation.

According to one preferred specific embodiment of the present invention, a stimulation device is provided, using which, an operating variable (current or voltage) supplied to the submodels may be brought into a working range or a frequency range that applies to the submodel.

DETAILED DESCRIPTION

Figure 1:
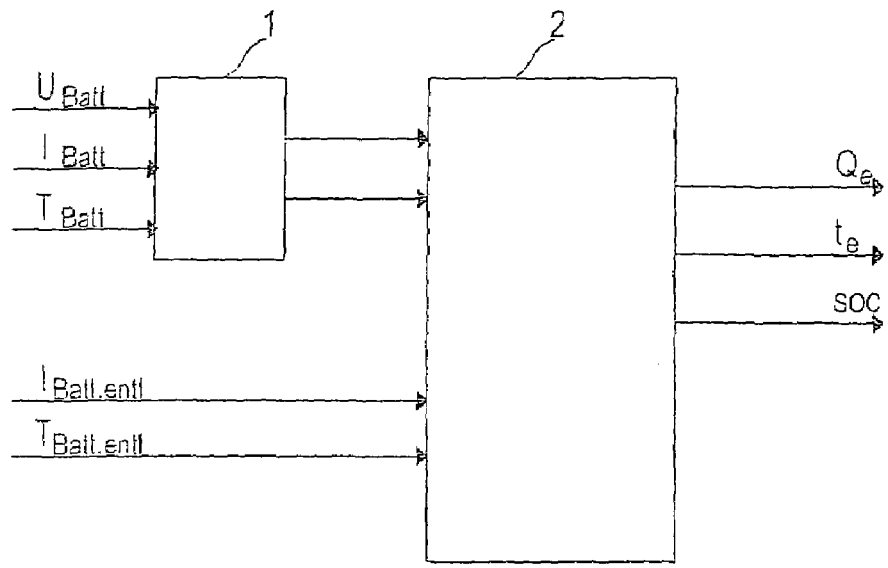
FIG. 1 shows a device known from the related art for calculating the load that is able to be drawn from an energy storage device.
Figure 2A:
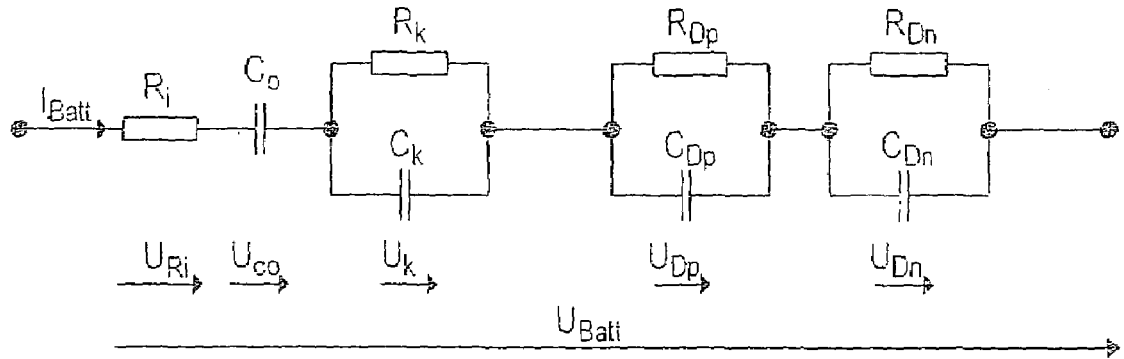
FIG. 2a shows an equivalent circuit diagram for a lead battery during a discharge procedure at low frequencies.

Reference is made to the introductory part of the specification regarding the clarification of FIGS. 1 and 2a.

Figure 3A:
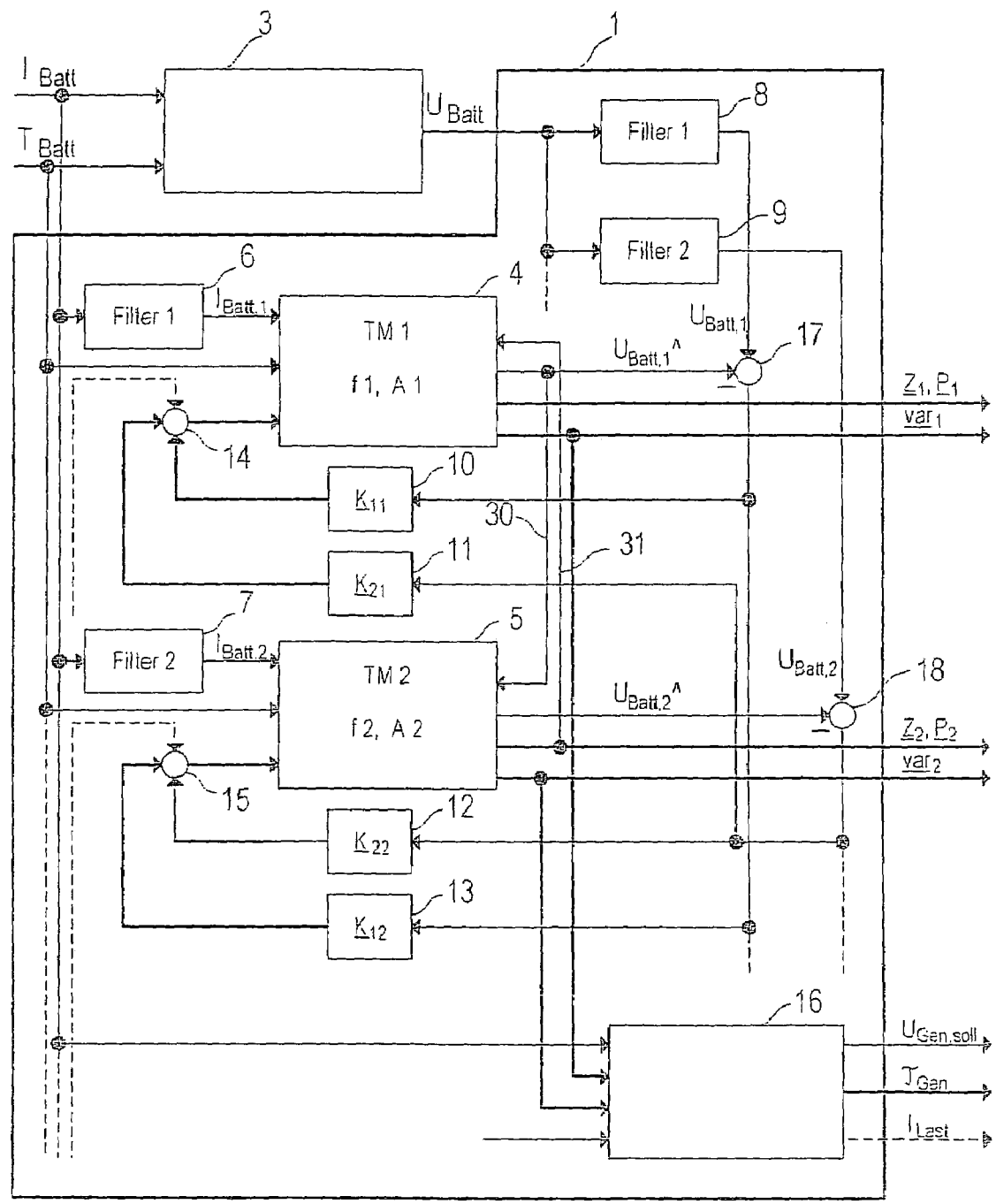
FIG. 3a shows the construction of a state variable and parameter estimator having a plurality of submodels according to a first specific embodiment of the present invention.

FIG. 3a shows the design principle of a state variable and parameter estimator 1 according to a first specific embodiment of the present invention. As may be seen, state variable and parameter estimator 1 includes a plurality of submodels 4, 5 which are in each case effective only in a certain frequency range and/or working range (f1,A1 or f2,A2), and which may thereby be kept very simple. However, submodels 4, 5 in their entirety cover the whole frequency range and working range of energy storage device 3.

Frequency ranges f1,f2, . . . and working ranges A1, A2, . . . may partially overlap. In the most favorable case, the entirety of submodels 4, 5 should at least, however, cover a working range A and a frequency range f of the energy storage unit that is as big as possible.

The working range of a submodel 4, 5 is specified by predefined conditions for battery current $I_{Batt}$, battery voltage $U_{Batt}$, battery temperature $T_{Batt}$, state variables Z and battery parameters P.

Individual state variables Z and parameters P may simultaneously appear and be estimated in several submodels 4, 5.

State variable and parameter estimator 1 shown in FIG. 3a includes at its input continuously measured battery values, in the present case, battery current $I_{Batt}$ (optionally, battery voltage $U_{Batt}$ may also be supplied) and battery temperature $T_{Batt}$. Battery current $I_{Batt}$ is restricted by suitable lowpass, highpass or bandpass filters 6, 7, 8, 9 respectively to frequency range f1, f2, in which the respective submodel 4, 5 is valid. A submodel 4, 5 (e.g. submodel 4), which is valid, for instance, in a frequency range f1 of more than 1 kHz, has, in the present case, a preconnected highpass filter 6. For example, a lowpass filter 7, 9 may be preconnected to submodel 5. If a submodel 4, 5 covers the entire frequency range f input filters 6, 9 for current and voltage may be omitted.

From the variables supplied, submodels 4, 5 respectively calculate a battery state variable ($I_{Batt^{\char`\^}}$ or $U_{Batt^{\char`\^}}$). The corresponding actual value ($I_{Batt}$ or $U_{Batt}$) is supplied to stat parameter estimator 1 as a measured value from outside. Estimated values $U_{Batt,1^{\char`\^}}$, $U_{Batt,2^{\char`\^}}$ or quantities derived therefrom (error signals) are fed back into the respective submodel 4, 5.

State variable and parameter estimator 1 includes difference nodes 17, 18 at which an error (differential signal) is formed from the estimated battery state variable $U_{Batt,1^{\char`\^}}$, $U_{Batt,2^{\char`\^}}$ and the respectively measured battery state variable $U_{Batt,1}$, $U_{Batt,2}$. The ascertained errors ($U_{Batt,1}-U_{Batt,1^{\char`\^}}$, $U_{Batt,2}-U_{Batt,2^{\char`\^}}$, ...) are then in each case supplied to a weighting unit 10, 12 and conducted to adding nodes.

In the error feedback, one may distinguish between the self-feedback and the external feedback. In the first case, the estimating error of a submodel (4) is supplied to the same submodel (4), and in the other case, the estimating error of a submodel (4) is supplied to another submodel (5). At adding nodes 14, 15 an overall error is generated from the individual (weighted) estimating errors and is supplied to respective submodel 4, 5.

An external feedback is preferably implemented only if certain state variables Z or parameters P appear in parallel in several submodels. In this case, state variables Z and parameters P may be adjusted with the other submodels.

For a state variable $Z_{1,j}$ in the jth submodel, which also occurs in submodels $I=j+1, \ldots, j+n$, the following difference equation is obtained:

$$Z_{1,j,k+1} = f(Z_{j,k}, P_{j,k}, I_{Batt,j,k}, T_{Batt,k}) + \sum_{i=j \ldots n} k_{z1,i,j} * (U_{Batt,i,k} - U_{Batt,i,k}\char`\^).$$

In this context, $f(Z_{j,k}, P_{j,k}, I_{Batt,j,k}, T_{Batt,k})$ is the righthand side of a state difference equation for state variable $Z_{1,j}$ of the jth submodel having the input variables: filtered battery current $I_{Batt,j,k}$ and battery temperature $T_{Batt,k}$ as well as the parameter vector $P_{j,k}$ in the kth time step.

For a constant parameter $P_{1,j}$ in the jth submodel, which also occurs in submodels $i=j+1, \ldots, j+n$, we obtain the following:

$$P_{1,j,k}+1 = P_{1,j,k} + \sum_{i=j \ldots n} k_{P1,i,j} * (U_{Batt,i,k} - U_{Batt,i,k}\char`\^).$$

The amplifications $k_{i,j}$ of weighting units 10-13 may be ascertained in a submodel 4, 5 in the case of a Luenberg observer by pole specification, and if a Kalman filter is used for submodels 4, 5, by minimization of a quality criterion such as, for instance, the minimum estimating error variance.

If the current working range and/or frequency range is located outside the valid working range and/or frequency range of a submodel 4, 5, there is not allowed to be an error feedback from such a submodel (e.g. submodel 5) to another submodel. In such a case, therefore, weighting factors $k_{i,j}$ of the corresponding weighting units (e.g. weighting unit 11) are set to zero. That means that $k_{i,j}=0$ if the working range of the ith submodel is left.

In the system shown in FIG. 3a, battery current $I_{Batt}$ is supplied to state variable and parameter estimator 1. According to another specific embodiment according to FIG. 3b, submodels 4, 5 may also be supplied with a (filtered) battery voltage $U_{Batt}$ as input variable. Submodels 4, 5 would, in this case, estimate a battery current $I_{Batt^{\char`\^}}$. The adjustment of the submodels is made via battery voltage $U_{Batt,1}, U_{Batt,2}, \ldots$, via battery currents $I_{Batt,1}, I_{Batt,2}, \ldots$, if the battery voltage is specified as an input variable and the battery current is specified as an output variable of the submodels.

State variables and/or parameters which were estimated by a submodel (4) and are also included in another submodel (5) are preferably also supplied to the other submodel (5). Connecting lines 30, 31 are provided to do this. In the other submodel (5) the values may be used as a starting values, as a fixed value or as a correcting values for the estimation.

Besides the state variables Z and the parameters P, submodels 4, 5 also supply the error variances ($var_1, var_2, \ldots$) of the variables. With that one may judge, for instance, whether the accuracy of the estimated variables Z, P is sufficient for the subsequent calculations of the loading state, the capacity and/or the load that is able to be drawn from the battery.

Figure 3B:
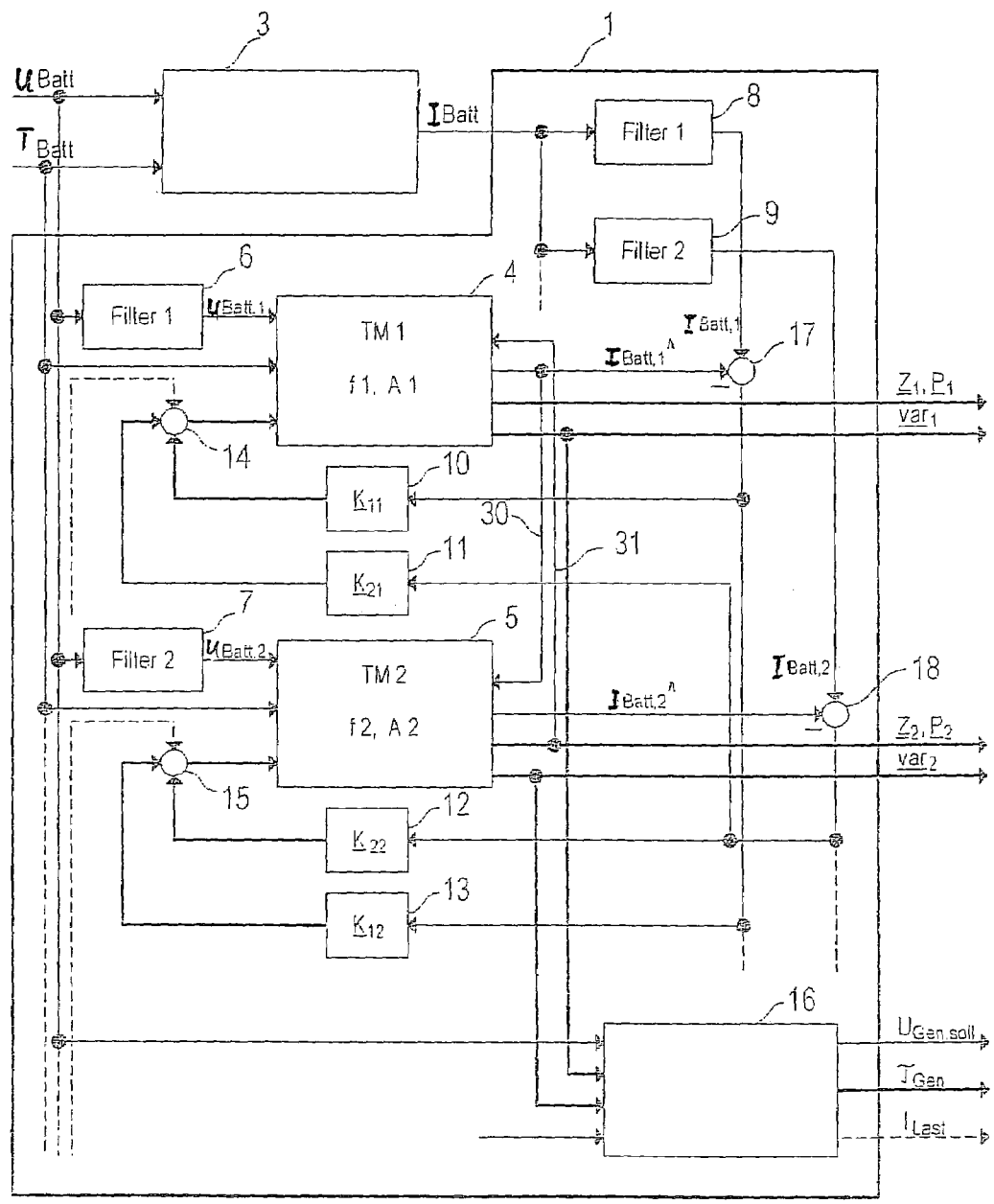
FIG. 3b shows the construction of a state variable and parameter estimator having a plurality of submodels according to a second specific embodiment of the present invention.

In a further variant, the adjustment of the submodel takes place additionally via the battery voltages $U_{Batt,1}$, $U_{Batt,2}, \ldots$, i.e. the structure as in FIG. 3a or 3b is used twice simultaneously, once using a submodel solved according to the battery voltage and once using a submodel solved according to the battery current. The simultaneously estimated state variables and parameters from the individual submodels of the two structures may then be, for example, linked, weighted using their error variance, to an estimating variable, according to the already described way of linking variables that are estimated in parallel in various submodels.

For the optimum utilization of all submodels 4, 5, the operating variables of battery 3 should run through the entire working ranges and frequency ranges of submodels 4, 5 during the course of the calculation. If the electrical network, to which battery 3 is connected, supplies too little stimulation (e.g. load fluctuations), the quantities are not able to be estimated accurately enough. If the stimulations in the network are low, the internal resistance $R_i$ of battery 3 is able to be estimated only very inaccurately. In response to stimulation over a longer period, especially in the case of safety-critical applications, problems may arise since no accurate statement may be arrived at on the capacity of the battery.

State variable and parameter estimator 1 therefore includes a stimulator 16, which is in a position to intervene actively in the electrical network and to set the working range and/or the frequency range of battery 3 or of the network in a desired manner. Stimulator 16 intervenes actively in the electrical network if the error variance of predefined state variables Z or parameters P is too large for a predefined time duration. The variances var calculated by the individual submodels 4, 5 are supplied to stimulator 16 as input variables.

The intervention in the electrical network by stimulator 16 takes place, for example, by specifying a new generator setpoint voltage $U_{Gen,soll}$ (in the case of a vehicle generator), a load response time constant $tau_{Gen}$ of a generator controller and/or by suitable users being switched on and off. By doing this, a battery current curve $I_{Batt}$, voltage curve $U_{Batt}$ and/or frequency curve, suitable for estimating the respective state variable Z or the respective parameter P may be impressed. Ideally, the desired battery current curve $I_{Batt}$ (or a voltage curve $U_{Batt}$) is specified in such a way that it transfers battery 3 into a working range A and excites it in a frequency range f, in which one of the submodels (e.g. submodel 5) which includes the estimating variable, is particularly accurate, and consequently the estimated variable is able to be determined very accurately. Naturally, in this context, the distance of this new working range from current working range A of battery 3 and the maximum admissible amplitudes of control variables $U_{Gen,soll}$, $tau_{Gen}$, $I_{Last}$ as well as the maximum permitted duration of the control intervention have to be taken into consideration.

Figure 4:
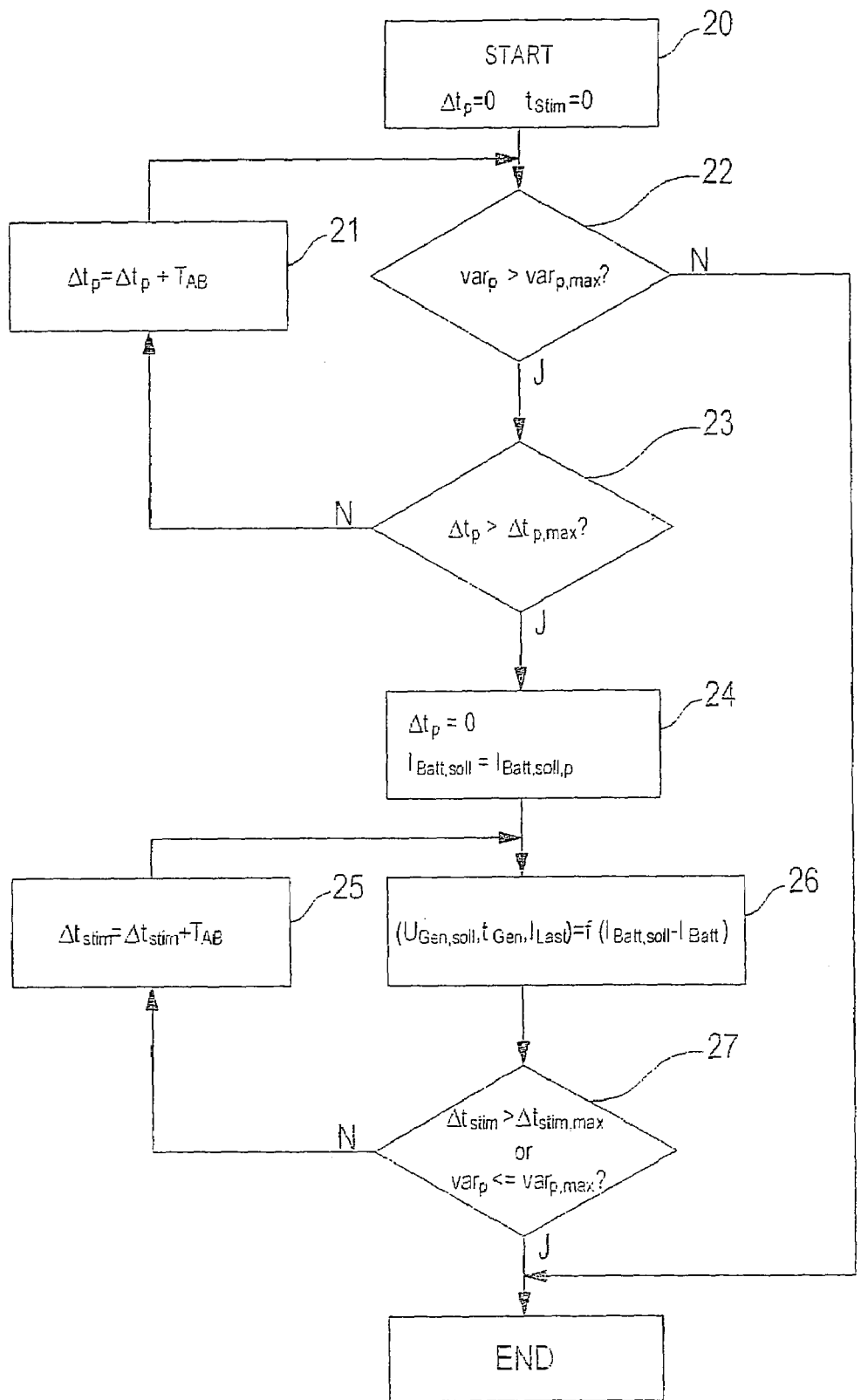
FIG. 4 shows a flow chart for showing the function of a stimulator.

The method of operating of stimulator 16 in FIG. 1 is shown, for instance in FIG. 4. The method begins at step 20 with the initializing of times $t_P$ and $t_{stim}$ to the values $t_P=0$, $t_{stim}=0$. In this context, $t_P$ denotes a time in which a parameter P is being monitored, and $t_{stim}$ denotes a stimulation time.

In step 22 it is checked whether the error variance $var_P$ is greater than a maximum error variance $var_{P,max}$. If not (N), stimulator 16 remains deactivated. If, for a time duration $t_P$, error variance $var_P$ remains greater than $t_{P,max}$ (step 23) and on the other hand greater than $var_{P,max}$, a current curve $I_{Batt,soll,P}$, that is assigned to parameter P, is impressed (step 24 and 26). This takes place until variance $var_P$ of parameter P is less than or equal to maximum variance $var_{P,max}$ of this parameter P or the duration of stimulation $t_{stim}$ is greater than a predefined maximum duration $t_{stim,max}$ (checking in step 27) The variable $t_{stim}$ for the duration of stimulation is increased iteratively in step 25 by respectively one scanning period $T_{Ab}$.

Figure 5:
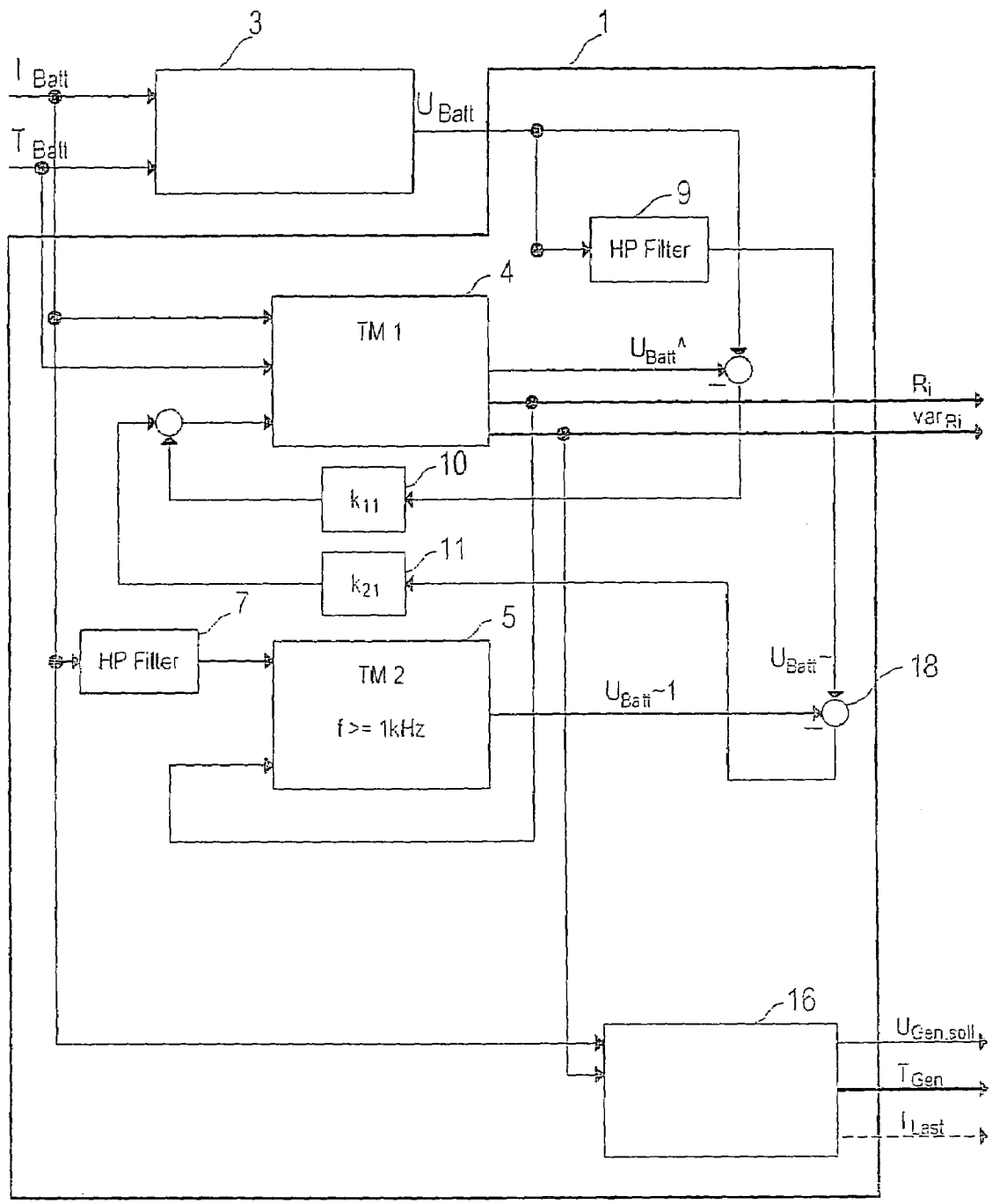
FIG. 5 shows the construction of a state variable and parameter estimator for calculating the internal resistances of a battery.

FIG. 5 shows a special layout of a state variable and parameter estimator 1 for determining the ohmic internal resistance $R_i$ of a lead battery 3. The internal resistance $R_i$ of a lead battery 3 is a decisive quantity in the determination of the state of a battery, such as the capacity of battery 3 or the load that may still be drawn from it.

State variable and parameter estimator 1 includes two mathematical submodels 4, 5, of which the first has valid application over the entire frequency range, and second submodel 5 is only applicable at frequencies equal to or greater than 1 kHz. Accordingly, no filter is preconnected to first submodel 4, but a highpass filter 7 is preconnected to second submodel 5.

Figure 2B:
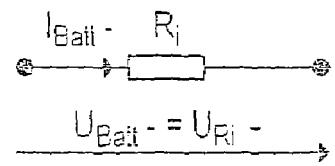
FIG. 2b shows an equivalent circuit diagram for a lead battery at high frequencies.

First submodel 4 includes a mathematical model description of the equivalent circuit diagram of FIG. 2a. Second submodel 5, on the other hand, includes a mathematical description of the equivalent circuit diagram of FIG. 2b, which is essentially only made up of internal resistance $R_i$ of battery 3. For, if we restrict ourselves to a frequency range of the order of magnitude of 1 kHz, and examine only high-frequency alternating components of current $I_{Batt}$ and voltage $U_{Batt}$, the capacitors of the equivalent circuit diagram of FIG. 2a may be regarded as being short-circuited. In this case, the only remaining component is the internal resistance $R_i$ of the battery. In the following case, first submodel 4 is valid only for discharge operation, since internal resistance $R_i$ of battery 3, in loading operation, may be estimated only with difficulty from the few measured quantities current $I_{Batt}$, voltage $U_{Batt}$ and temperature $T_{Batt}$.

For first submodel 4, to which the estimating errors $U_{Batt}-U_{Batt^\wedge}$ or $U_{Batts}-U_{Batts^\wedge}$ are supplied, the following applies:

$$R_{i,k+1}=R_{i,k}\pm k_{11}(U_{Batt}-U_{Batt^\wedge})+k_{21}(U_{Batt^-}-U_{Batt^{-\wedge}})$$

For second submodel 5

$$R_{i,k+1}=R_{i,k}$$

The value calculated from submodel 4 for internal resistance $R_i$ of battery 3 is supplied to second submodel 5 and may there be used as the initial value, for example. In this case, the weighting units for second submodel 5, having weighting factors $k_{22}$ and $k_{12}$, maybe omitted. On the other hand, weighting units 10, 11, for the error feedback into submodel 4, remain in force.

It should be observed that, in loading operation, weighting factor $k_{11}$ should be set to zero, since first submodel 4 is not valid for loading operation. Weighting factors $k_{11}$ and $k_{21}$ may be determined, for example, via an observer design according to Luenberg or Kalman.

LIST OF REFERENCE NUMERALS 1 state variable and parameter estimator
2 load predictor
3 battery
4 first submodel
5 second submodel
6-9 filter
10-13 weighting units
14,15 adding nodes
16 stimulator
17,18 adding nodes
20-27 method steps
30,31 connecting lines

What is claimed is:

1. A method for determining state variables and parameters of a mathematical energy storage model by a state variable and parameter estimator, comprising:
    causing the state variable and parameter estimator to calculate the state variables and the parameters of the mathematical energy storage model from operating variables of an energy storage device, wherein:
        the state variable and parameter estimator includes a plurality of mathematical submodels that are validly applicable for at least one of different working ranges and different frequency ranges of the energy storage device, and
        the state variables and parameters are used to perform one of energy management and user management of an electrical network.

2. The method as recited in claim 1, wherein:
the mathematical model is of a battery model.

3. The method as recited in claim 1, further comprising:
supplying one of a current and a voltage of the energy storage device to the submodels; and
restricting one of a current and a voltage restricted by a filter to the frequency range valid for at least one of the submodels.

4. The method as recited in claim 1, further comprising:
ascertaining an error between an operating variable of the energy storage device and an operating variable calculated by one of the submodels; and
feeding back the error into the respective submodel.

5. The method as recited in claim 4, further comprising:
feeding back the error into another one of the submodels.

6. The method as recited in claim 4, further comprising:
weighing the error in accordance with a factor.

7. The method as recited in claim 1, further comprising:
supplying one of a state variable calculated by one of the submodels and a calculated parameter to another of the submodels.

8. The method as recited in claim 7, further comprising:
feeding back one of the state variable and the calculated parameter in a weighted state.

9. The method as recited in claim 1, further comprising:
providing a stimulator in order to bring one of a current and a voltage that will be supplied to the submodels into one of a working range and a frequency range valid for the submodels.

10. A state variable and parameter estimator for determining state variables and parameters of a mathematical energy storage model, comprising:

an arrangement for calculating the state variables and the parameters from operating variables of an energy storage device; and an arrangement for storing a plurality of submodels that are valid for at least one of different working ranges and different frequency ranges of the energy storage device.

11. The state variable and parameter estimator as recited in claim 10, wherein:

the mathematical model is of a battery model.

12. The state variable and parameter estimator as recited in claim 10, further comprising:

a filter connected in incoming circuit with at least one of the submodels in order to restrict the operating variables supplied to the submodels to the frequency range that is valid for one of the submodels.

13. The state variable and parameter estimator as recited in claim 10, further comprising:

an arrangement for ascertaining an error between an operating variable of the energy storage device and an operating variable calculated by one of the submodels; and an arrangement for feeding back the error into the respective submodel.

14. The state variable and parameter estimator as recited in claim 13, further comprising:

an arrangement for feeding back the error into another submodel.

15. The state variable and parameter estimator as recited in claim 13, further comprising:

an arrangement for weighting the error that is fed back.

16. The state variable and parameter estimator as recited in claim 10, further comprising:

a stimulator for bringing one of a current curve and a voltage curve to be supplied to the submodels into one of a working range and a frequency range valid for the submodels.

17. The state variable and parameter estimator as recited in claim 10, further comprising:

a filter connected in incoming circuit with at least one of the submodels in order to restrict the operating variables supplied to the submodels to the frequency range that is valid for one of the submodels;

wherein the mathematical model is of a battery model.

18. The state variable and parameter estimator as recited in claim 17, further comprising:

an arrangement for ascertaining an error between an operating variable of the energy storage device and an operating variable calculated by one of the submodels; and an arrangement for feeding back the error into the respective submodel.

19. The state variable and parameter estimator as recited in claim 18, further comprising:

an arrangement for feeding back the error into another submodel; and an arrangement for weighting the error that is fed back.

20. The state variable and parameter estimator as recited in claim 17, further comprising:

a stimulator for bringing one of a current curve and a voltage curve to be supplied to the submodels into one of a working range and a frequency range valid for the submodels.

21. The method as recited in claim 1, further comprising:

supplying one of a current and a voltage of the energy storage device to the submodels; and restricting one of a current and a voltage restricted by a filter to the frequency range valid for at least one of the submodels;

wherein the mathematical model is of a battery model.

22. The method as recited in claim 21, further comprising:

ascertaining an error between an operating variable of the energy storage device and an operating variable calculated by one of the submodels;

feeding back the error into the respective submodel; and feeding back the error into another one of the submodels.

23. The method as recited in claim 22, further comprising:

weighing the error in accordance with a factor; and supplying one of a state variable calculated by one of the submodels and a calculated parameter to another of the submodels.

24. The method as recited in claim 23, further comprising:

feeding back one of the state variable and the calculated parameter in a weighted state.

25. The method as recited in claim 21, further comprising:

providing a stimulator in order to bring one of a current and a voltage that will be supplied to the submodels into one of a working range and a frequency range valid for the submodels.

* * * * *